US011188694B2

(12) United States Patent
Li et al.

(10) Patent No.: US 11,188,694 B2
(45) Date of Patent: Nov. 30, 2021

(54) DYNAMIC SIMULATION METHOD OF CIRCULATING TEMPERATURE VARIATION IN RMR SUBSEA PUMP MUD-LIFT DRILLING SYSTEM

(71) Applicant: SOUTHWEST PETROLEUM UNIVERSITY, Chengdu (CN)

(72) Inventors: Xin Li, Chengdu (CN); Jie Zhang, Chengdu (CN); Cuinan Li, Chengdu (CN); Peigang Wang, Chengdu (CN); Xuefeng Sun, Chengdu (CN); Xiaoxiao Du, Chengdu (CN); Weilin Chen, Chengdu (CN); Lin Chen, Chengdu (CN)

(73) Assignee: SOUTHWEST PETROLEUM UNIVERSITY, Chengdu (CN)

( * ) Notice: Subject to any disclaimer, the term of this patent is extended or adjusted under 35 U.S.C. 154(b) by 0 days.

(21) Appl. No.: 17/147,418

(22) Filed: Jan. 12, 2021

(65) Prior Publication Data

US 2021/0216689 A1 Jul. 15, 2021

(30) Foreign Application Priority Data

Aug. 6, 2020 (CN) .......................... 202010781330.4

(51) Int. Cl.
*G06F 30/28* (2020.01)
*G06F 17/11* (2006.01)
(52) U.S. Cl.
CPC .................................. *G06F 30/28* (2020.01)
(58) Field of Classification Search
CPC ................................. G06F 30/28; G06F 17/11
See application file for complete search history.

(56) References Cited

U.S. PATENT DOCUMENTS 9,834,998 B2 * 12/2017 Holck .................. E21B 19/084
2009/0114443 A1 * 5/2009 Talamo ................ E21B 21/015
175/7

(Continued)

OTHER PUBLICATIONS

"Calculation Model of Equivalent Circulation Density in Riserless Drilling", Jiang Wenlong et al., <<China Petroleum Machinery>>, vol. 47, Issue 6, 2019, pp. 61-66, Jun. 30, 2019.

*Primary Examiner* — Vuthe Siek (57) ABSTRACT

The invention discloses a dynamic simulation method of circulating temperature variation in RMR subsea pump mud-lift drilling system, including steps: obtaining operating parameters, environmental parameters, well structure parameters and thermal parameters of target well; establishing temperature control equation of drill string in seawater section, temperature control equation of drill string in formation section, temperature control equation of annulus in formation section, and temperature control equation of return pipe in seawater section; re-determining initial and boundary conditions; discretizing spatial structure of the whole system with inner node method; discretizing control equations on corresponding nodes; substituting corresponding parameters into discrete expressions to obtain circulating temperature in drill string of seawater section, circulating temperature in drill string of formation section, circulating temperature in annulus of formation section, and circulating temperature in return pipe of seawater section. The dynamic analysis model established by the present invention is more suitable for actual operating conditions.

4 Claims, 3 Drawing Sheets

(56) References Cited

U.S. PATENT DOCUMENTS

2016/0090794 A1* 3/2016 Holck .................. E21B 19/008
166/352
2017/0175929 A1* 6/2017 Fuhst .................... F16K 47/023
2018/0135360 A1* 5/2018 Holck .................... E21B 19/02
2021/0140279 A1* 5/2021 Mathis ................... E21B 41/10

* cited by examiner

DYNAMIC SIMULATION METHOD OF CIRCULATING TEMPERATURE VARIATION IN RMR SUBSEA PUMP MUD-LIFT DRILLING SYSTEM

BACKGROUND OF THE INVENTION

Field of the Invention

The present invention relates to a dynamic simulation method of circulating temperature variation in RMR subsea pump mud-lift drilling system, belonging to the technical field of deepwater oil and gas well drilling.

Description of Related Art

With the increasing demand for energy in the world, the exploration and development of deepwater oil and gas resources have become more important. When drilling with conventional offshore drilling technologies, the huge suspension load of the riser will increase the risk of platform operations, and it is difficult to cope with the narrow safety pressure window encountered in deepwater drilling operations. Based on the above problems, the Norwegian company AGR has developed a riserless subsea pump mud-lift drilling system (Riserless Mud Recovery System, RMR).

As there are no risers in the RMR system, the drill string in seawater section is directly exposed to seawater, and the drilling fluid in the drill string will exchange heat with the external seawater. Secondly, this drill string and the return pipe used for drilling fluid return are two independent components, and will not exchange heat mutually, which results in great difference from the characteristics of circulating temperature variation of the fluid in the RMR system in deepwater drilling operation to that of conventional offshore drilling technology, while temperature is a key factor affecting various operating parameters.

At present, the models used in the RMR system to calculate the fluid temperature variation are mainly the analytical solution models established by H. R. Lima and F. F. Pereira, with such a disadvantage that they can only simulate the temperature variation results under different operating parameters, but cannot simulate the temperature variation results within any operating period. The simulated condition is different from the actual drilling operation.

Therefore, it is necessary to establish a mathematical model suitable for simulating the circulating temperature variation of the whole system according to the structural characteristics of the RMR system, and conduct a dynamic simulation analysis on the fluid circulating temperature variation in the relevant component during deepwater drilling operation, so as to provide the associated theoretical basis for temperature management of the whole system when the RMR system is used for deepwater drilling operation.

SUMMARY OF THE INVENTION

The problem solved by the present invention is how to improve the navigation operation accuracy of the track paving machine, and reduce errors in the track paving operation.

The invention proposes a dynamic simulation method of circulating temperature variation in RMR subsea pump mud-lift drilling system to overcomes the shortcomings in the prior art.

The technical solution provided by the present invention to solve the above technical problems is a dynamic simulation method of circulating temperature variation in RMR subsea pump mud-lift drilling system, including the following steps:

Step 1: obtaining the operating parameters, environmental parameters, well structure parameters and thermal parameters of target well;

Step 2: establishing temperature control equation of drill string in seawater section, temperature control equation of drilling string in formation section, temperature control equation of annulus in formation section, and temperature control equation of return pipe in seawater section;

Step 3: re-determining initial and boundary conditions;

Step 4: discretizing spatial structure of the whole system with inner node method;

Step 5: discretizing control equations on corresponding nodes;

Step 6: substituting the parameters obtained in Step 1 into the discrete expressions in Step 5 to obtain circulating temperature in drill string of seawater section, circulating temperature in drill string of formation section, circulating temperature in annulus of formation section, and circulating temperature in return pipe of seawater section.

Further, the operating parameters include drilling fluid density, drilling fluid injection temperature, mechanical drilling speed, drilling pump displacement, subsea pump displacement and inner diameter of return pipe; environmental parameters include operating water depth, sea surface temperature and geothermal gradient; well structure parameters include well depth, borehole diameter, casing outer diameter, casing inner diameter, drill string outer diameter and drilling inner diameter; and the thermal parameters include specific heat capacity of drilling fluid, specific heat capacity of drilling string, specific heat capacity of casing, specific heat capacity of cement sheath, specific heat capacity of return pipe, thermal conductivity of drilling fluid, thermal conductivity of drilling string, thermal conductivity of casing, thermal conductivity of cement sheath and thermal conductivity of return pipe.

Further, the temperature control equation of drill string in seawater section is:

$$\rho_m A_{pipe} c_m \frac{\partial T_{ps}}{\partial t} = -\rho_m A_{pipe} v_{pipe} c_m \frac{\partial T_{ps}}{\partial t} - 2\pi R_{pi} U_{ps}(T_{ps} - T_{sea});$$

$$\frac{1}{U_{ps}} = \frac{1}{h_{pi}} + \frac{R_{pi}}{R_{po} h_{sea}} + \frac{R_{pi}}{K_{pipe}} \ln(R_{po}/R_{pi}).$$

The temperature control equation of drill string in formation section is:

$$\rho_m A_{pipe} c_m \frac{\partial T_{pf}}{\partial t} = -\rho_m A_{pipe} v_{pipe} c_m \frac{\partial T_{pf}}{\partial t} + 2\pi R_{pi} U_{ap}(T_{ann} - T_{pf}).$$

The temperature control equation of annulus is:

$$\rho_m A_{ann} c_m \frac{\partial T_{ann}}{\partial t} = \rho_m A_{ann} v_{ann} c_m \frac{\partial T_{ann}}{\partial z} + 2\pi R_w h_w (T_f - T_{ann}) - 2\pi R_{pi} U_{ap}(T_{ann} - T_{pf});$$

-continued $$\frac{1}{U_{ap}} = \frac{1}{h_{pi}} + \frac{R_{pi}}{R_{po}h_{po}} + \frac{R_{pi}}{K_{pipe}}\ln(R_{po}/R_{pi}).$$

And the temperature control equation of return pipe in seawater section is:

$$Tret \geq Tsea: \rho_m A_{ret} c_m \frac{\partial T_{ret}}{\partial t} = -\rho_m A_{ret} v_{ret} c_m \frac{\partial T_{ret}}{\partial z} - 2\pi R_{ri} U_{rs}(T_{ret} - T_{sea})$$

$$Tret < Tsea: \rho_m A_{ret} c_m \frac{\partial T_{ret}}{\partial t} = -\rho_m A_{ret} v_{ret} c_m \frac{\partial T_{ret}}{\partial z} + 2\pi R_{ri} U_{rs}(T_{sea} - T_{ret})$$

$$\frac{1}{U_{rs}} = \frac{1}{h_{ri}} + \frac{R_{ri}}{R_{ro}h_{sea}} + \frac{R_{ri}}{K_{ret}}\ln(R_{ro}/R_{ri}).$$

Where: $\rho_m$ is the drilling fluid density, in kg/m³; $c_m$ is specific heat capacity of drilling fluid, in J/(kg·° C.); $A_{pipe}$, $A_{ann}$ and $A_{ret}$ are cross-sectional areas of the drill string, the annulus and the return pipe, respectively, in m²; $v_{pipe}$, $v_{ann}$ and $v_{ret}$ are fluid velocity in the drill string, annulus and return pipe, respectively, in m/s; $T_{sea}$, $T_f$, $T_{ps}$, $T_{pf}$, $T_{ann}$ and $T_{ret}$ are circulating seawater temperature, circulating formation temperature, circulating temperature in drill string in seawater section, circulating temperature in drill string in formation section, circulating temperature in annulus and circulating temperature in return pipe, respectively, in ° C.; $R_{pi}$, $R_{po}$, $R_w$, $R_{ri}$ and $R_{po}$ are the inner radius of drill string, the outer radius of drill string, the radius of the wellbore, the inner radius of return pipe, and the outer radius of return pipe, respectively, in m; $U_{ps}$, $U_{ap}$ and $U_{rs}$ are the total heat transfer coefficient between the fluid in drill string and external seawater, the fluid in the annulus and the fluid in drill string, and the fluid in return pipe and external seawater, respectively, in W/(m·° C.); $h_{pi}$, $h_{po}$, $h_{ri}$, $h_w$, and $h_{sea}$ are the convective heat transfer coefficient between the fluid in drill string and the inner wall of drill string, the fluid in the annulus and the outer wall of drill string, the fluid in return pipe and the inner wall of return pipe, the fluid in the annulus and the well wall, and seawater and the outer wall of relevant structure, respectively, in W/(m·° C.); $K_{pipe}$ and $K_{ret}$ are the thermal conductivity of the drill string and the return pipe, respectively, in W/(m·° C.).

Further, the initial and boundary conditions are as follows:

(1) At the initial moment, the fluid temperature in the drill string and return pipe in seawater section is equal to the external seawater temperature.

(2) At the initial moment, the fluid temperature in the drill string and annulus in formation section is equal to the formation temperature.

(3) At the top node of the drill string, the fluid temperature is always the injection temperature.

(4) At the downhole node, the fluid temperature in the drill string and annulus in formation section are equal.

Further, the discrete expression of each equation in Step 4 is as follows:

Discrete expression of the temperature control equation of drill string in seawater section:

$$C_1(T_{ps})_{i-1}^{n+1} + (A_1 - B_1 - C_1)(T_{ps})_i^{n+1} = A_1(T_{ps})_i^n - B_1(T_{sea})_i^{n+1}.$$

Discrete expression of the temperature control equation of drill string in formation section:

$$C_2(T_{pf})_{i-1}^{n+1} + (A_2 + B_2 - C_2)(T_{pf})_i^{n+1} = A_2(T_{pf})_i^n + B_2(T_{ann})_i^{n+1}.$$

Discrete expression of the temperature control equation of annulus in formation section:

$$D_3(T_{ann})_{i-1}^{n+1} + (A_3 + B_3 - C_3 - D_3)(T_{ann})_i^{n+1} = A_3(T_{ann})_i^n + B_3(T_f)_i^{n+1} - C_3(T_{pf})_i^{n+1}.$$

Discrete expression of the temperature control equation of return pipe in seawater section:

$$Tret \geq Tsea: B_4(T_{ret})_{i-1}^{n+1} + (A_4 - B_4 - C_4)(T_{ret})_i^{n+1} = A_4(T_{ann})_i^n - C_4(T_{sea})_i^{n+1}.$$

$$Tret < Tsea: B_5(T_{ret})_{i-1}^{n+1} + (A_5 - B_5 + C_5)(T_{ret})_{i-1}^{n+1} = A_5(T_{ret})_i^n - C_5(T_{sea})_i^{n+1}.$$

Where, $T_{sea}$, $T_f$, $T_{ps}$, $T_{pf}$, $T_{ann}$ and $T_{ret}$ are the circulating seawater temperature, the circulating formation temperature, the circulating temperature in drill string in seawater section, the circulating temperature in drill string in formation section, the circulating temperature in annulus and the circulating temperature in return pipe, respectively, in ° C.; $A_1$, $B_1$ and $C_1$ are constants of the temperature control equation of drill string in seawater section, respectively; $A_2$, $B_2$ and $C_2$ are constants of the temperature control equation of drill string in formation section, respectively; $A_3$, $B_3$, $C_3$ and $D_3$ are constants in the temperature control equation of annulus, respectively; $A_4$, $B_4$ and $C_4$ are constants of the temperature control equation of return pipe in seawater section when the fluid temperature in the return pipe is greater than or equal to the external seawater temperature, respectively; $A_5$, $B_5$, $C_5$ are constants of the temperature control equation of return pipe in seawater section when the fluid temperature in return pipe is less than the external seawater temperature, respectively.

The present invention has the following beneficial effects: Compared with the analytical solution models established by H. R. Lima and F. F. Pereira, the dynamic analysis model established by the present invention is more suitable for actual operating conditions, and the simulation result is more accurate.

BRIEF DESCRIPTION OF THE DRAWINGS

Aspects of the present invention are best understood from the following detailed description when read with the accompanying figures. The exemplary embodiments of the present invention and the description thereof are used to explain the present invention, and do not constitute improper limitations on the preset invention. In the drawings.

DESCRIPTION OF THE PREFERRED EMBODIMENTS

In order to enable the above objects, features and advantages of the disclosure to be more apparent and easily understood, the specific embodiments of the disclosure will be further elaborated hereafter in connection with the drawings.

A dynamic simulation method of circulating temperature variation in RMR subsea pump mud-lift drilling system provided by the present invention includes the following steps:

Step 1: obtaining the operating parameters, environmental parameters, well structure parameters and thermal parameters of target well;

Step 2: establishing temperature control equation of drill string in seawater section, temperature control equation of drilling string in formation section, temperature control equation of annulus in formation section, and temperature control equation of return pipe in seawater section.

Figure 1:
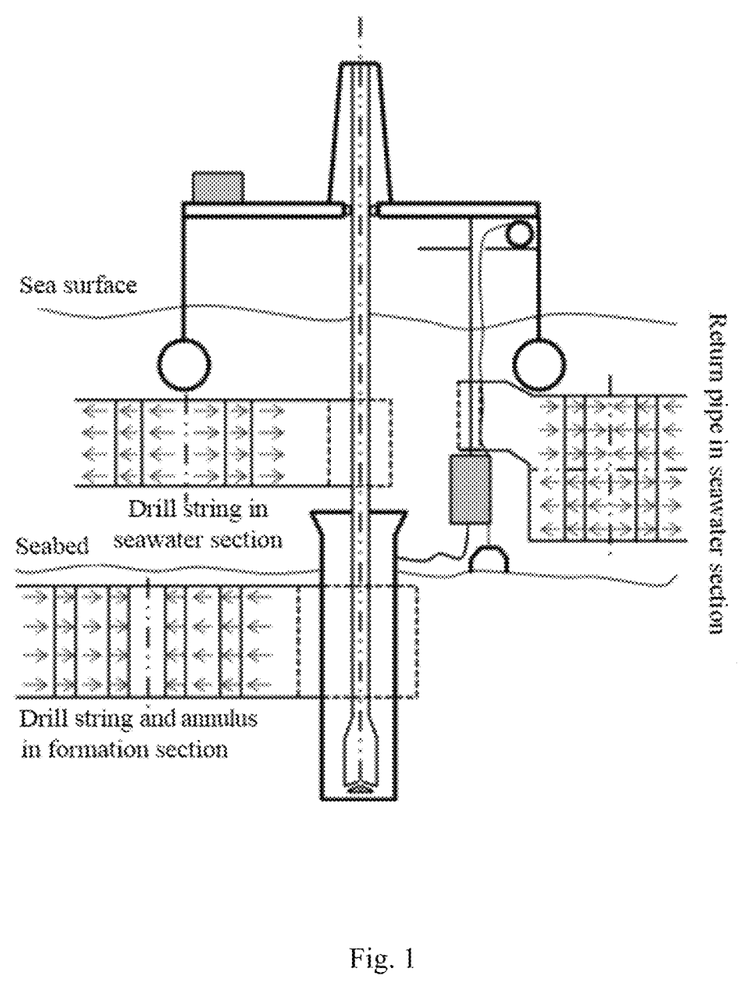
FIG. 1 shows a physical model of fluid heat exchange process in the components of the RMR system.

In the establishment of the above temperature control equations, the fluid heat exchange mode in each component of the system should be determined first. The physical model of the fluid heat transfer process in the relevant component is shown in FIG. 1. As shown in FIG. 1, the drill string in the seawater section is directly exposed to seawater and the seawater temperature is often low, so the drilling fluid in the drill string will transfer its heat to external seawater through the inner and outer walls of drill string in the way of convective heat transfer and heat conduction, which is quite different from the fluid heat exchange method of conventional offshore drilling technology; however, the heat exchange method of fluid in drill string in formation section and annulus is still the same as that of conventional offshore drilling technology. On the other hand, the drilling fluid in the return pipe in seawater section may transfer its heat to external seawater in the way of convective heat transfer and heat conduction. It is also possible to absorb heat from external seawater in the same way. In the specific calculation, it is necessary to distinguish the heat transfer direction of this return pipe in seawater section.

The flow direction of the fluid in each component is selected as the positive direction, and the control volume per unit length is intercepted from the associated part. Secondly, the calculation equation heat when the associated heat exchange occurs is derived according to the heat exchange mode of the fluid in each component. Finally, according to the law of heat conservation, the heat calculation equations in the same component are combined to obtain the relevant control equation as follows:

The temperature control equation of drill string in seawater section is:

$$\rho_m A_{pipe} c_m \frac{\partial T_{ps}}{\partial t} = -\rho_m A_{pipe} v_{pipe} c_m \frac{\partial T_{ps}}{\partial t} - 2\pi R_{pi} U_{ps}(T_{ps} - T_{sea});$$

$$\frac{1}{U_{ps}} = \frac{1}{h_{pi}} + \frac{R_{pi}}{R_{po} h_{sea}} + \frac{R_{pi}}{K_{pipe}} \ln(R_{po}/R_{pi}).$$

The temperature control equation of drill string in formation section is:

$$\rho_m A_{pipe} c_m \frac{\partial T_{pf}}{\partial t} = -\rho_m A_{pipe} v_{pipe} c_m \frac{\partial T_{pf}}{\partial t} + 2\pi R_{pi} U_{ap}(T_{ann} - T_{pf}).$$

The temperature control equation of annulus is:

$$\rho_m A_{ann} c_m \frac{\partial T_{ann}}{\partial t} =$$
$$\rho_m A_{ann} v_{ann} c_m \frac{\partial T_{ann}}{\partial z} + 2\pi R_w h_w (T_f - T_{ann}) - 2\pi R_{pi} U_{ap}(T_{ann} - T_{pf}).$$
$$\frac{1}{U_{ap}} = \frac{1}{h_{pi}} + \frac{R_{pi}}{R_{po} h_{po}} + \frac{R_{pi}}{K_{pipe}} \ln(R_{po}/R_{pi}).$$

And the temperature control equation of return pipe in seawater section is:

$$T_{ret} \geq T_{sea} \quad \rho_m A_{ret} c_m \frac{\partial T_{ret}}{\partial t} = -\rho_m A_{ret} v_{ret} c_m \frac{\partial T_{ret}}{\partial z} - 2\pi R_{ri} U_{rs}(T_{ret} - T_{sea}).$$

$$T_{ret} < T_{sea} \quad \rho_m A_{ret} c_m \frac{\partial T_{ret}}{\partial t} = -\rho_m A_{ret} v_{ret} c_m \frac{\partial T_{ret}}{\partial z} + 2\pi R_{ri} U_{rs}(T_{sea} - T_{ret}).$$

$$\frac{1}{U_{rs}} = \frac{1}{h_{ri}} + \frac{R_{ri}}{R_{ro} h_{sea}} + \frac{R_{ri}}{K_{ret}} \ln(R_{ro}/R_{ri}).$$

Where: $\rho_m$ is the density of drilling fluid, in kg/m³; $c_m$ is the specific heat capacity of drilling fluid, in J/(kg·° C.); $A_{pipe}$, $A_{ann}$ and $A_{ret}$ are the cross-sectional area of the drill string, annulus and return pipe, respectively, in m²; $v_{pipe}$, $v_{ann}$ and $v_{ret}$ are the fluid velocity in the drill string, annulus and return pipe, respectively, in m/s; $T_{sea}$, $T_f$, $T_{ps}$, $T_pf$, $T_{ann}$ and $T_{ret}$ are circulating seawater temperature, circulating formation temperature, circulating temperature in drill string in seawater section, circulating temperature in drill string in formation section, circulating temperature in annulus and circulating temperature in return pipe, respectively, in ° C.; $R_{pi}$, $R_{pi}$, $R_w$, $R_{ri}$ and $R_{po}$ are the inner radius of drill string, the outer radius of drill string, the radius of the wellbore, the inner radius of return pipe, and the outer radius of return pipe, respectively, in m; $U_{ps}$, $U_{ap}$ and $U_{rs}$ are the total heat transfer coefficient between the fluid in drill string and external seawater, the fluid in the annulus and the fluid in drill string, and the fluid in return pipe and external seawater, respectively, in W/(m° C.); $h_{pi}$, $h_{po}$, $h_{ri}$, $h_w$ and $h_{sea}$ are the convective heat transfer coefficient between the fluid in drill string and the inner wall of drill string, the fluid in the annulus and the outer wall of drill string, the fluid in return pipe and the inner wall of return pipe, the fluid in the annulus and the well wall, and seawater and the outer wall of relevant structure, respectively, in W/(m° C.); $K_{pipe}$ and $K_{ret}$ are the thermal conductivity of the drill string and the return pipe, respectively, in W/(m° C.).

Step 3: Redetermine the initial and boundary conditions; (1) At the initial moment, the fluid temperature in the drill string and return pipe in seawater section was equal to the external seawater temperature; (2) At the initial moment, the fluid temperature in the drill string and annulus in formation section was equal to the formation temperature; (3) At the top node of the drill string, the fluid temperature was always the injection temperature; (4) At the downhole node, the fluid temperature in the drill string and annulus in formation section were equal.

Figure 2:
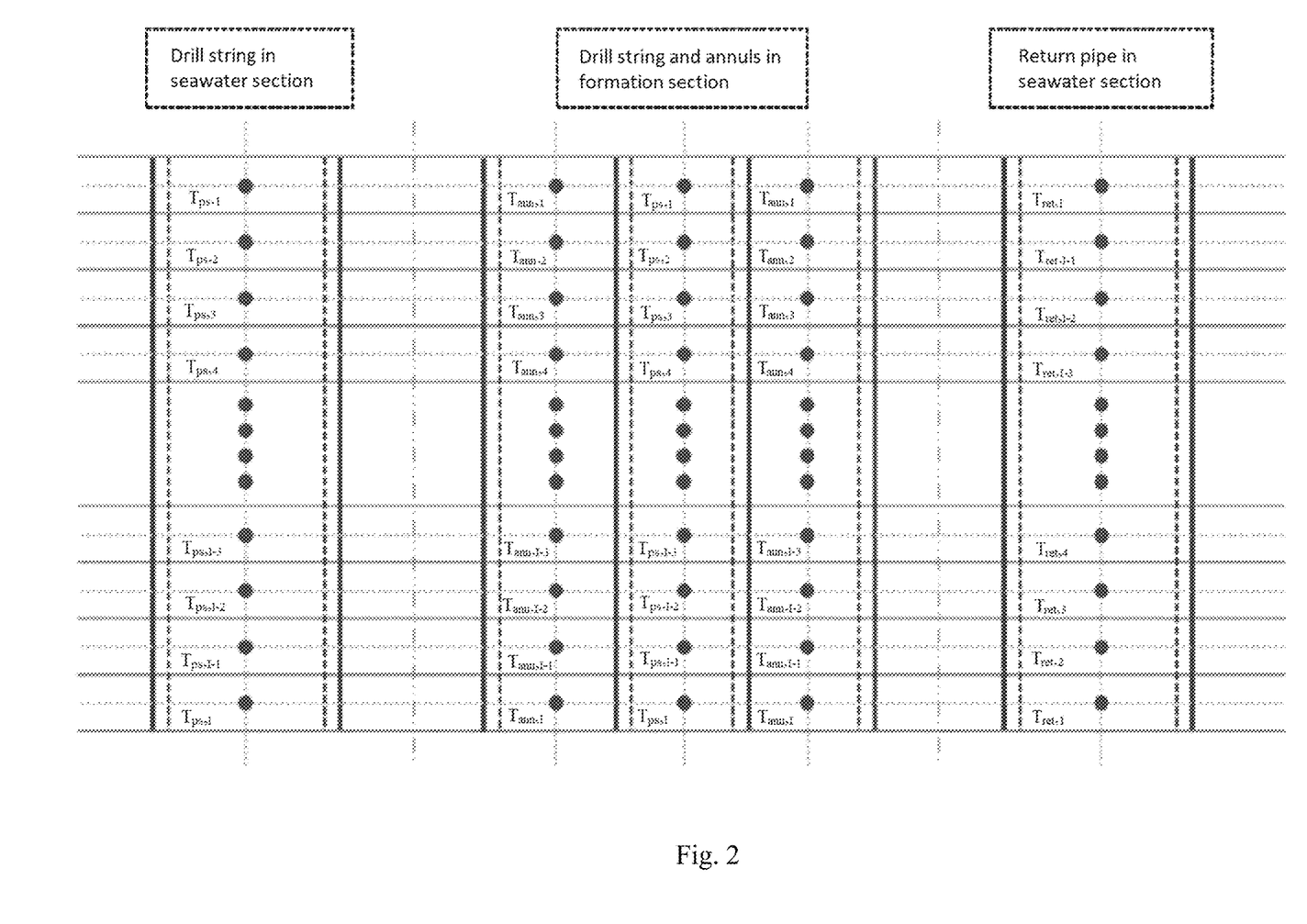
FIG. 2 shows the result of discretization of spatial region.

Step 4: Discretize the spatial structure of the whole system with inner node method, and the result of discretization of spatial region is shown in FIG. 2.

Step 5: The two-point forward differencing scheme is used for the time term, and the two-point backward differencing scheme is used for the space term. The time interval $\Delta t$ is set to 1 s, and the space interval $\Delta h$ is set to 1 m;

The temperature control equation of drill string in seawater section is:

$$C_1(T_{ps})_{i-1}^{n+1} + (A_1 - B_1 - C_1)(T_{ps})_i^{n+1} = A_1(T_{ps})_i^n - B_1(T_{sea})_i^{n+1}.$$

Discrete expression of the temperature control equation of drill string in formation section:

$$C_2(T_{pf})_{i-1}^{n+1} + (A_2 + B_2 - C_2)(T_{pf})_i^{n+1} = A_2(T_{pf})_i^n + B_2(T_{ann})_i^{n+1}.$$

Discrete expression of the temperature control equation of annulus in formation section:

$$D_3(T_{ann})_{i-1}^{n+1} + (A_3 + B_3 - C_3 - D_3)(T_{ann})_i^{n+1} = A_3(T_{ann})_i^n + B_3(T_f)_i^{n+1} - C_3(T_{pf})_i^{n+1}.$$

Discrete expression of the temperature control equation of return pipe in seawater section:

$$Tret \geq Tsea: B_4(T_{ret})_{i-1}^{n+1} + (A_4 - B_4 - C_4)(T_{ret})_i^{n+1} = A_4 (T_{ann})_i^n - C_4(T_{sea})_i^{n+1}.$$

$$Tret < Tsea: B_5(T_{ret})_{i-1}^{n+1} + (A_5 - B_5 + C_5)(T_{ret})_{i-1}^{n+1} = A_5 (T_{ret})_i^n - C_5(T_{sea})_i^{n+1}.$$

Where, $T_{sea}$, $T_f$, $T_{ps}$, $T_{pf}$, $T_{ann}$ and $T_{ret}$ are circulating seawater temperature, circulating formation temperature, circulating temperature in drill string in seawater section, circulating temperature in drill string in formation section, circulating temperature in annulus and circulating temperature in return pipe, respectively, in ° C.; $A_1$, $B_1$ and $C_1$ are constants of the temperature control equation of drill string in seawater section, respectively; $A_2$, $B_2$ and $C_2$ are constants of the temperature control equation of drilling string in formation section, respectively; $A_3$, $B_3$, $C_3$ and $D_3$ are constants in the temperature control equation of annulus, respectively; $A_4$, $B_4$ and $C_4$ are constants of the temperature control equation of return pipe in seawater section when the fluid temperature in the return pipe is greater than or equal to the external seawater temperature, respectively; $A_5$, $B_5$, $C_5$ are constants of the temperature control equation of return pipe in seawater section when the fluid temperature in return pipe is less than the external seawater temperature, respectively.

Step 6: Finally, substitute the parameters obtained in Step 1 into the discrete expressions in Step 5 to obtain the circulating temperature in the drill string of seawater section, the circulating temperature in the drill string of formation section, the circulating temperature in the annulus of formation section, and the circulating temperature in the return pipe of seawater section.

EMBODIMENT

In an oilfield, one well was drilled from 2,613 m to 2,781 m deep within 12 hours. The operating parameters include drilling fluid density of 1.36 g/cm3, drilling fluid injection temperature of 30° C., ROP of 14 m/h, drilling pump displacement of 45 L/s, subsea pump displacement of 30 L/s, and return pipe inner diameter of 53.4 mm. The environmental parameters include operating water depth of 1,200 m, seawater surface temperature of 25° C., and geothermal gradient of 3° C./100 m. The seawater temperature was calculated according to the water temperate of the South China Sea. The specific well structure data are shown in Table 1, and the thermal parameters used in calculation are shown in Table 2.

TABLE 2

Thermal parameter table

| Parameter | Value | Parameter | Value |
|---|---|---|---|
| Specific heat capacity of drilling fluid/J · (kg · ° C.)$^{-1}$ | 2439.9 | Thermal conductivity of drilling fluid/W · (m · ° C.)$^{-1}$ | 0.73 |
| Specific heat capacity of drilling pipe/J · (kg · ° C.)$^{-1}$ | 417 | Thermal conductivity of drilling pipe/W · (m · ° C.)$^{-1}$ | 36.23 |
| Specific heat capacity of casing/J · (kg · ° C.)$^{-1}$ | 432 | Thermal conductivity of casing/W · (m · ° C.)$^{-1}$ | 41.23 |
| Specific heat capacity of cement sheath/J · (kg · ° C.)$^{-1}$ | 2100 | Thermal conductivity of cement sheath/W · (m · ° C.)$^{-1}$ | 0.67 |
| Specific heat capacity of return pipe/J · (kg · ° C.)$^{-1}$ | 364 | Thermal conductivity of return pipe/W · (m · ° C.)$^{-1}$ | 27.41 |

In drilling process, dynamic analysis model, H. R. IMA model and F. F. Pereira model were used respectively to simulate the circulating temperature variation of the whole system. The simulation results of the three models when drilling to 2,781 m are shown in FIG. 3.

Figure 3:
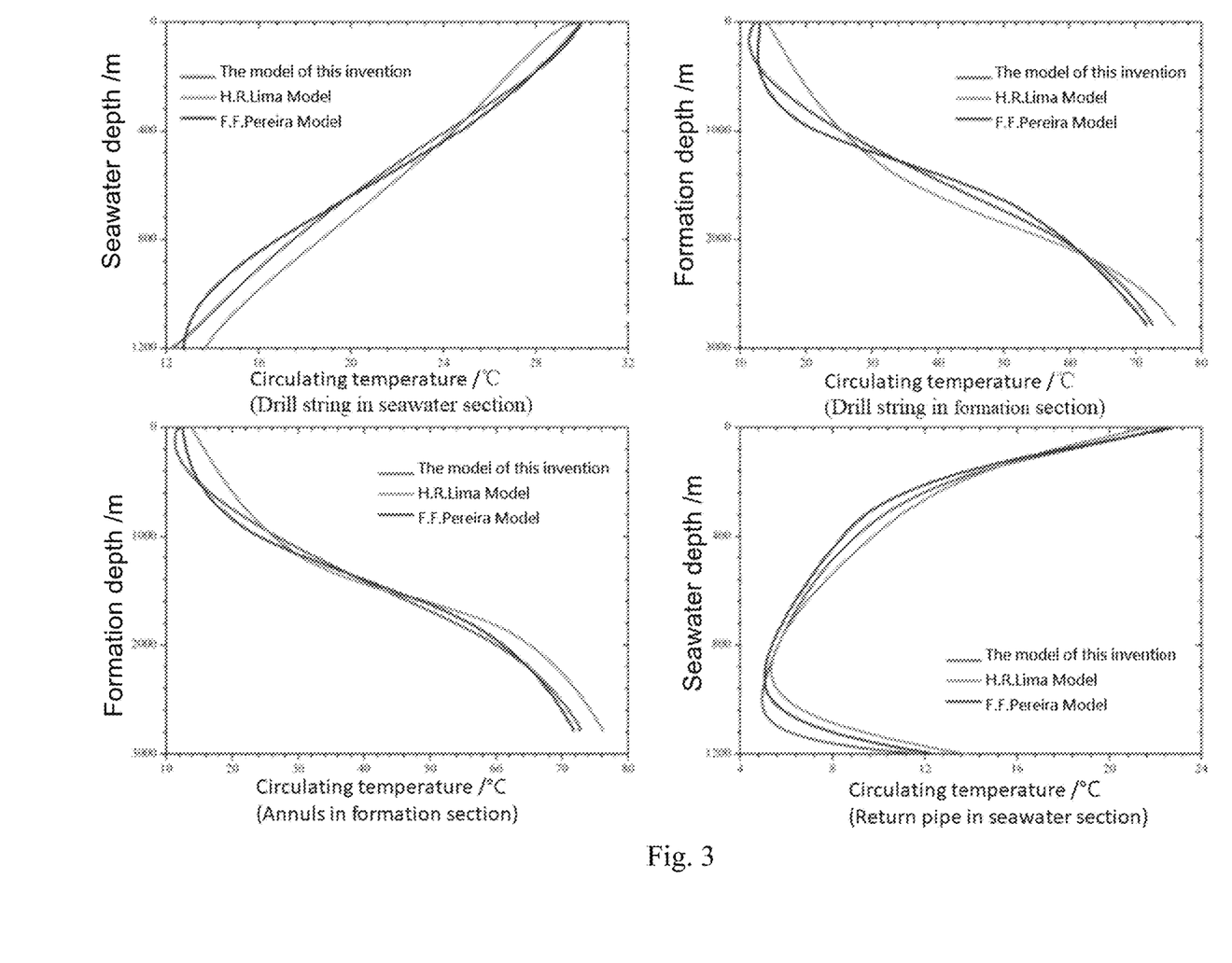
FIG. 3 shows the comparison of the calculation results of different models.

It can be found from FIG. 3 that the simulation results of the dynamic analysis model established in the present invention were basically between the results of the two analytical solution models. Therefore, the simulation results of the dynamic analysis model were more accurate. On the other hand, compared to the analytical solution models of H. R. Lima and F. F. Pereira, the dynamic analysis model can dynamically simulate the circulating temperature within different operating hours during the drilling process, which is more in line with the actual situation of drilling operation.

The above are not intended to limit the present invention in any form. Although the present invention has been disclosed as above with embodiments, it is not intended to limit the present invention. Those skilled in the art, within the scope of the technical solution of the present invention, can use the disclosed technical content to make a few changes or modify the equivalent embodiment with equivalent changes. Within the scope of the technical solution of the present invention, any simple modification, equivalent change and modification made to the above embodiments

TABLE 1

Well structure data sheet

| | | | Casing | | Drill Pipe | |
|---|---|---|---|---|---|---|
| Spud-ins | Well Depth/m | Borehole Diameter/mm | Outer Diameter/mm | Inner Diameter/mm | Outer Diameter/mm | Inner Diameter/mm |
| First spud-in | 145 | 660.4 | 508.0 | 482.6 | 139.7 | 121.4 |
| Second spud-in | 1794 | 444.5 | 339.7 | 313.6 | 127.0 | 108.6 |
| Third spud-in | 2781 | 311.1 | 244.5 | 224.4 | 114.3 | 97.2 | according to the technical essence of the present invention are still regarded as a part of the technical solution of the present invention.

What is claimed is:

1. A dynamic simulation method of circulating temperature variation in RMR subsea pump mud-lift drilling system, comprising the following steps:

Step 1: obtaining operating parameters, environmental parameters, well structure parameters and thermal parameters of a target well;

Step 2: respectively establishing a temperature control equation of drill string in seawater section, a temperature control equation of drill string in formation section, a temperature control equation of annulus in formation section, and a temperature control equation of return pipe in seawater section;

wherein the temperature control equation of drill string in seawater section is:

$$\rho_m A_{pipe} c_m \frac{\partial T_{ps}}{\partial t} = -\rho_m A_{pipe} v_{pipe} c_m \frac{\partial T_{ps}}{\partial t} - 2\pi R_{pi} U_{ps}(T_{ps} - T_{sea});$$

$$\frac{1}{U_{ps}} = \frac{1}{h_{pi}} + \frac{R_{pi}}{R_{po} h_{sea}} + \frac{R_{pi}}{K_{pipe}} \ln(R_{po}/R_{pi});$$

the temperature control equation of drill string in formation section is:

$$\rho_m A_{pipe} c_m \frac{\partial T_{pf}}{\partial t} = -\rho_m A_{pipe} v_{pipe} c_m \frac{\partial T_{pf}}{\partial t} + 2\pi R_{pi} U_{ap}(T_{ann} - T_{pf});$$

the temperature control equation of annulus is:

$$\rho_m A_{ann} c_m \frac{\partial T_{ann}}{\partial t} =$$

$$\rho_m A_{ann} v_{ann} c_m \frac{\partial T_{ann}}{\partial z} + 2\pi R_w h_w (T_f - T_{ann}) - 2\pi R_{pi} U_{ap}(T_{ann} - T_{pf});$$

$$\frac{1}{U_{ap}} = \frac{1}{h_{pi}} + \frac{R_{pi}}{R_{po} h_{po}} + \frac{R_{pi}}{K_{pipe}} \ln(R_{po}/R_{pi});$$

the temperature control equation of return pipe in seawater section is:

$$T_{ret} \geq T_{sea}: \rho_m A_{ret} c_m \frac{\partial T_{ret}}{\partial t} = -\rho_m A_{ret} v_{ret} c_m \frac{\partial T_{ret}}{\partial z} - 2\pi R_{ri} U_{rs}(T_{ret} - T_{sea});$$

$$T_{ret} < T_{sea}: \rho_m A_{ret} c_m \frac{\partial T_{ret}}{\partial t} = -\rho_m A_{ret} v_{ret} c_m \frac{\partial T_{ret}}{\partial z} + 2\pi R_{ri} U_{rs}(T_{sea} - T_{ret});$$

$$\frac{1}{U_{rs}} = \frac{1}{h_{ri}} + \frac{R_{ri}}{R_{ro} h_{sea}} + \frac{R_{ri}}{K_{ret}} \ln(R_{ro}/R_{ri})$$

where: $\rho_m$ is the drilling fluid density, in kg/m³; $c_m$ is specific heat capacity of drilling fluid, in J/(kg·°C.); $A_{pipe}$, $A_{ann}$ and $A_{ret}$ are cross-sectional areas of the drill string, the annulus and the return pipe, respectively, in m²; $v_{pipe}$, $v_{ann}$ and $v_{ret}$ are fluid velocity in the drill string, annulus and return pipe, respectively, in m/s; $T_{sea}$, $T_f$, $T_{ps}$, $T_{pf}$, $T_{ann}$ and $T_{ret}$ are circulating seawater temperature, circulating formation temperature, circulating temperature in drill string in seawater section, circulating temperature in drill string in formation section, circulating temperature in annulus and circulating temperature in return pipe, respectively, in °C.; $R_{pi}$, $R_{po}$, $R_w$, $R_{ri}$ and $R_{po}$ are the inner radius of drill string, the outer radius of drill string, the radius of the wellbore, the inner radius of return pipe, and the outer radius of return pipe, respectively, in m; $U_{ps}$, $U_{ap}$ and $U_{rs}$ are the total heat transfer coefficient between the fluid in drill string and external seawater, the fluid in the annulus and the fluid in drill string, and the fluid in return pipe and external seawater, respectively, in W/(m°C.); $h_{pi}$, $h_{po}$, $h_{ri}$, $h_w$ and $h_{sea}$ are the convective heat transfer coefficient between the fluid in drill string and the inner wall of drill string, the fluid in the annulus and the outer wall of drill string, the fluid in return pipe and the inner wall of return pipe, the fluid in the annulus and the well wall, and seawater and the outer wall of relevant structure, respectively, in W/(m°C.); $K_{pipe}$ and $K_{ret}$ are the thermal conductivity of the drill string and the return pipe, respectively, in W/(m·°C.); $K_{pipe}$ and $K_{ret}$ are the thermal conductivity of the drill string and the return pipe, respectively, in W/(m·°C.); t represents a circulating time;

Step 3: re-determining initial condition and boundary condition;

Step 4: discretizing a spatial structure of the whole system with an inner node method;

Step 5: discretizing the control equations on corresponding nodes; and

Step 6: substituting the parameters obtained in Step 1 into the discrete expressions in Step 5 to obtain a circulating temperature in the drill string of seawater section, a circulating temperature in the drill string of formation section, a circulating temperature in the annulus of formation section, and a circulating temperature in the return pipe of seawater section.

2. The dynamic simulation method of circulating temperature variation in RMR subsea pump mud-lift drilling system according to claim 1, wherein the operating parameters comprise drilling fluid density, drilling fluid injection temperature, mechanical drilling speed, drilling pump displacement, subsea pump displacement and inner diameter of return pipe, the environmental parameters comprise operating water depth, sea surface temperature and geothermal gradient; the well structure parameters comprise well depth, borehole diameter, casing outer diameter, casing inner diameter, drill string outer diameter and drilling inner diameter, and the thermal parameters include specific heat capacity of drilling fluid, specific heat capacity of drill string, specific heat capacity of casing, specific heat capacity of cement sheath, specific heat capacity of return pipe, thermal conductivity of drilling fluid, thermal conductivity of drill string, thermal conductivity of casing, thermal conductivity of cement sheath and thermal conductivity of return pipe.

3. The dynamic simulation method of circulating temperature variation in RMR subsea pump mud-lift drilling system according to claim 1, wherein the initial and boundary conditions are as follows:

(1) at the initial moment, the fluid temperature in the drill string and return pipe in seawater section is equal to the external seawater temperature;

(2) at the initial moment, the fluid temperature in the drill string and annulus in formation section is equal to the formation temperature; and (3) at the top node of the drill string, the fluid temperature is always the injection temperature;

(4) at the downhole node, the fluid temperature in the drill string and annulus in formation section are equal.

4. The dynamic simulation method of circulating temperature variation in RMR subsea pump mud-lift drilling system according to claim 1, wherein the discrete expression of each equation in Step 4 is as follows:

discrete expression of the temperature control equation of drill string in seawater section:

$$C_1(T_{ps})_{i-1}^{n+1}+(A_1-B_1-C_1)(T_{ps})_i^{n+1}=A_1(T_{ps})_i^n-B_1(T_{sea})_i^{n+1};$$

discrete expression of the temperature control equation of drill string in formation section:

$$C_2(T_{pf})_{i-1}^{n+1}+(A_2+B_2-C_2)(T_{pf})_i^{n+1}=A_2(T_{pf})_i^n+B_2(T_{ann})_i^{n+1};$$

discrete expression of the temperature control equation of annulus in formation section:

$$D_3(T_{ann})_{i-1}^{n+1}+(A_3+B_3-C_3-D_3)(T_{ann})_i^{n+1}=A_3(T_{ann})_i^n+B_3(T_f)_i^{n+1}-C_3(T_{pf})_i^{n+1};$$

discrete expression of the temperature control equation of return pipe in seawater section:

$Tret \geq Tsea$: $B_4(T_{ret})_{i-1}^{n+1}+(A_4-B_4-C_4)(T_{ret})_i^{n+1}=A_4(T_{ann})_i^n-C_4(T_{sea})_i^{n+1};$ $Tret < Tsea$: $B_5(T_{ret})_{i-1}^{n+1}+(A_5-B_5+C_5)(T_{ret})_{i-1}^{n+1}=A_5(T_{ret})_i^n-C_5(T_{sea})_i^{n+1};$ where, $T_{sea}$, $T_f$, $T_{ps}$, $T_{pf}$, $T_{ann}$ and $T_{ret}$ are the circulating seawater temperature, the circulating formation temperature, the circulating temperature in drill string in seawater section, the circulating temperature in drill string in formation section, the circulating temperature in annulus and the circulating temperature in return pipe, respectively, in °C.; $A_1$, $B_1$ and $C_1$ are constants of the temperature control equation of drill string in seawater section, respectively; $A_2$, $B_2$ and $C_2$ are constants of the temperature control equation of drill string in formation section, respectively; $A_3$, $B_3$, $C_3$ and $D_3$ are constants in the temperature control equation of annulus, respectively; $A_4$, $B_4$ and $C_4$ are constants of the temperature control equation of return pipe in seawater section when the fluid temperature in the return pipe is greater than or equal to the external seawater temperature, respectively; $A_5$, $B_5$, $C_5$ are constants of the temperature control equation of return pipe in seawater section when the fluid temperature in return pipe is less than the external seawater temperature, respectively; n represents a time node; i represents a space node.

* * * * *